United States Patent
Wolff et al.

(10) Patent No.: US 7,015,853 B1
(45) Date of Patent: Mar. 21, 2006

(54) DATA CONVERTER WITH REDUCED DIFFERENTIAL NONLINEARITY

(75) Inventors: Clinton R. Wolff, Westminster, CO (US); John Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/076,790

(22) Filed: Mar. 9, 2005

(51) Int. Cl.
*H03M 1/38* (2006.01)

(52) U.S. Cl. .................................. 341/155; 341/161

(58) Field of Classification Search ............... 341/172, 341/144, 155, 163, 119, 120, 161; 257/467; 374/178, 183; 438/237
See application file for complete search history.

(56) References Cited

U.S. PATENT DOCUMENTS

| | | | |
|---|---|---|---|
| 4,336,526 A | | 6/1982 | Weir |
| 4,831,381 A | | 5/1989 | Hester |
| 5,272,481 A | * | 12/1993 | Sauer ........................ 341/165 |
| 5,621,409 A | | 4/1997 | Cotter et al. |
| 5,638,071 A | | 6/1997 | Capofreddi et al. |
| 5,675,340 A | | 10/1997 | Hester et al. |
| 5,870,052 A | * | 2/1999 | Dedic et al. ................. 341/161 |
| 6,167,132 A | * | 12/2000 | Krone et al. ............ 379/399.01 |
| 6,255,970 B1 | | 7/2001 | Krymski |
| 6,323,792 B1 | | 11/2001 | Regier |
| 6,404,375 B1 | | 6/2002 | Munoz et al. |
| 6,424,276 B1 | | 7/2002 | Munoz et al. |
| 6,486,806 B1 | * | 11/2002 | Munoz et al. ............... 341/120 |
| 6,559,789 B1 | | 5/2003 | Somayajula |
| 6,587,066 B1 | | 7/2003 | Somayajula |
| 6,778,126 B1 | | 8/2004 | Ali |
| 6,844,840 B1 | | 1/2005 | Melanson |
| 6,850,181 B1 | * | 2/2005 | Tsinker ........................ 341/163 |
| 2004/0041721 A1 | | 3/2004 | Jiang et al. |

OTHER PUBLICATIONS

Sidman et al. (Feb. 5, 1987) EDN, pp. 139-156.

* cited by examiner

*Primary Examiner*—Brian Young
(74) *Attorney, Agent, or Firm*—Law Office of Dan Shifrin, PC

(57) ABSTRACT

Methods and apparatus are provided for reducing nonlinearities in an analog-to-digital signal converter. An analog pseudo-random noise sample is added to an analog input sample and the combined sample is converted into a digital representation. A pseudo-random digital sample corresponding to the analog noise sample is subtracted from the converted digital representation. Preferably, multiple analog noise samples are added to the analog input sample, converted and corresponding digital noise samples subtracted from the converted digital representation. The multiple digital representations are then averaged, thereby nullifying differential nonlinearities in various portions of the transfer characteristics curve of the signal converter and reducing the effects of the DNL.

34 Claims, 7 Drawing Sheets

US 7,015,853 B1

DATA CONVERTER WITH REDUCED DIFFERENTIAL NONLINEARITY

TECHNICAL FIELD

The present invention relates generally to analog to digital and digital to analog data converters and, in particular, to reducing digital nonlinearity in data converters.

BACKGROUND ART

Data converters are commonly used devices to interface between the physical world and the computer world. Analog-to-digital converters (ADC) translate an analog signal into a corresponding digital representation while digital-to-analog converters (DAC) perform the reverse operation. There are numerous categories of ADCs, including (among others) flash, delta-sigma, dual-slope integration and successive approximation register ADCs. The present invention will be described in the context of an ADC and, in particular, will be described in the context of a successive approximation register (SAR) ADC. However, the present invention is not in any way limited to being used in a SAR ADC and may be used in any suitable data converter.

As illustrated in FIG. 1, in a prior art SAR ADC 100, an analog input voltage from an analog signal is held in a sample/hold circuit 102 and input to a comparator 104. Under the direction of SAR control logic 106, an N-bit register 108 is initialized to midscale (with the most significant bit set to 1 and all other bits set to 0). The register output is converted to an analog value $V_{DAC}$ in an N-bit D/A converter (DAC) 110; analog value $V_{DAC}$ will thus equal ½ the reference voltage $V_{REF}$ provided to the D/A converter 110. Analog value $V_{DAC}$ is coupled to the other input of the comparator 104 and compared with the analog input voltage. If the analog input voltage is greater than analog value $V_{DAC}$, the output of the comparator 104 is a 1 and the most significant bit of the register remains a 1. If the analog input voltage is less than analog value $V_{DAC}$, the output of the comparator 104 is a 0 and the most significant bit of the register is set to 0. The SAR control logic 106 then sets the next most significant bit of the register 108 to 1 and another comparison is performed. The process is continued until a comparison has been performed with the least significant bit of the register 108 set to 1. At completion, an N-bit digital representation of the analog input voltage is stored in the register 108 and may be output serially or in parallel.

FIG. 2 is a plot of the transfer characteristics of an ideal ADC in which, as the analog input voltage increases, the digital output code increments with a step width of the value of one least significant bit (LSB). Typically, the output is less than ideal due to any of several types of errors, such as (among others) offset errors, gain errors, integral nonlinearity errors and differential nonlinearity (DNL) errors.

One common configuration of the DAC inside an SAR ADC includes a resistive ladder network which creates binary weighted currents. Another configuration includes a capacitive ladder network with weighted values employing charge redistribution to generate the analog output voltage. The operation of the charge redistribution DAC (CRDAC) is well known. However, the linearity of an SAR ADC is at least partially dependent upon the linearity of the internal DAC and, when a CRDAC is used, slight variations in capacitor values may contribute to nonlinearities. Even after the capacitors have been trimmed and calibrated, such factors as aging and fluctuations in temperature or reference voltage may still cause linearity errors. FIG. 3 is a plot of the transfer characteristics of an ADC with DNL errors, as indicated by some step widths greater than or less than 1 LSB.

Various techniques have been developed to address the issue of differential nonlinearity. Some involve lookup tables utilized to correct the DAC output by adding/subtracting correction values. Others involve regular recalibration of the DAC capacitors.

Consequently, a need remains for reducing differential nonlinearities in data converters such as successive approximation analog-to-digital converters.

SUMMARY OF THE INVENTION

The present invention provides a method for reducing nonlinearities in an N-bit successive approximation analog-to-digital signal converter with a charge redistribution digital-to-analog converter portion (CRDAC). The method includes storing an analog input signal sample in each of N–k capacitors in the CRDAC, generating a first pseudo-random digital noise sample, applying the first pseudo-random digital noise sample to capacitors in the CRDAC representing the remaining k bits, wherein a first pseudo-random analog noise sample corresponding to the first pseudo-random digital noise sample is added to the analog input signal sample to form a first combined analog signal sample, converting the first combined analog signal sample to a first combined digital signal, and subtracting the first pseudo-random digital noise sample from the first converted digital combined signal to generate a first digital output signal sample Preferably, the input signal sample is added to a plurality of pseudo-random noise samples, the resulting combined sample is converted and the noise is subtracted from the result. The plurality of resulting output signal samples are averaged. Thus, effects from differential nonlinearities which appear in different portions of the transfer characteristics of an ADC may be substantially reduced.

In a further embodiment, the first pseudo-random digital noise sample is generated in a m-bit maximal length linear feedback shift register (LFSR) having coefficients $g_0-g_m$ and a k-bit output. In another embodiment, the values of the N capacitors in the CRDAC are calculated according to a radix =2 series and, in still another embodiment, the values are calculated according to a radix <2 series.

Other methods, as well as apparatus, are also provided by the present invention.

DETAILED DESCRIPTION OF THE PREFERRED EMBODIMENT

Figure 4:
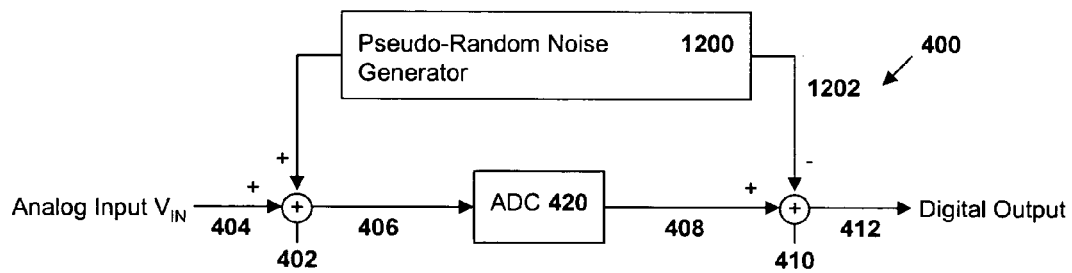
FIG. 4 is a block diagram of an analog-to-digital conversion device in which the present invention may be incorporated to reduce DNL.

FIG. 4 is a block diagram of an analog-to-digital conversion device 400 in which the present invention may be incorporated. The device 400 includes a summing component 402 to which an analog input signal $V_{IN}$ 404 is coupled. As used herein, the term "couple" should not be interpreted as being limited only to direct connections between two components, devices or means (generically referred to as "elements") but may also refer to an indirect relationship in which two elements are separated by one or more intermediary elements such that a path exists between the two elements which includes the intermediary element(s). The device 400 further includes a pseudo-random noise generator 1200 having an analog noise signal coupled to the summer 402 where it is added to the analog input signal $V_{IN}$ 404 to form a combined analog signal 406. The device 400 also includes an analog- to-digital converter (ADC) 420 coupled to receive the combined analog signal 406 from the summer 402. The ADC 420 converts a sample of the combined analog signal 406 into a digital representation signal 408. A sample/hold function to "freeze" the combined analog signal 406 is an inherent part of a charge redistribution SAR ADC. The output of the ADC 420, comprising a converted combined digital signal 408, is coupled to an input of a second summer 410.

The pseudo-random noise generator 1200 also outputs a digital noise signal 1202 which corresponds to, and is a digital representation of, the analog noise signal. The digital noise signal 1202 is input to another input of the second summer 410 where it is subtracted from the converted combined digital signal 408. The second summer 410 thus provides a digital output signal 412 from which the pseudo-random noise has been removed.

If a differential nonlinearity (DNL) occurs in the ADC 420 at the location on the transfer characteristic curve which corresponds to the voltage level of the analog input signal $V_{IN}$ 404, adding the analog pseudo-random noise signal adds or subtracts an offset to the analog input signal $V_{IN}$ 404 to effectively move the signal 404 to a different location on the transfer characteristic curve. Consequently, the nonlinearity at that particular location no longer affects the digital output 408 resulting from the data conversion.

Figure 1:
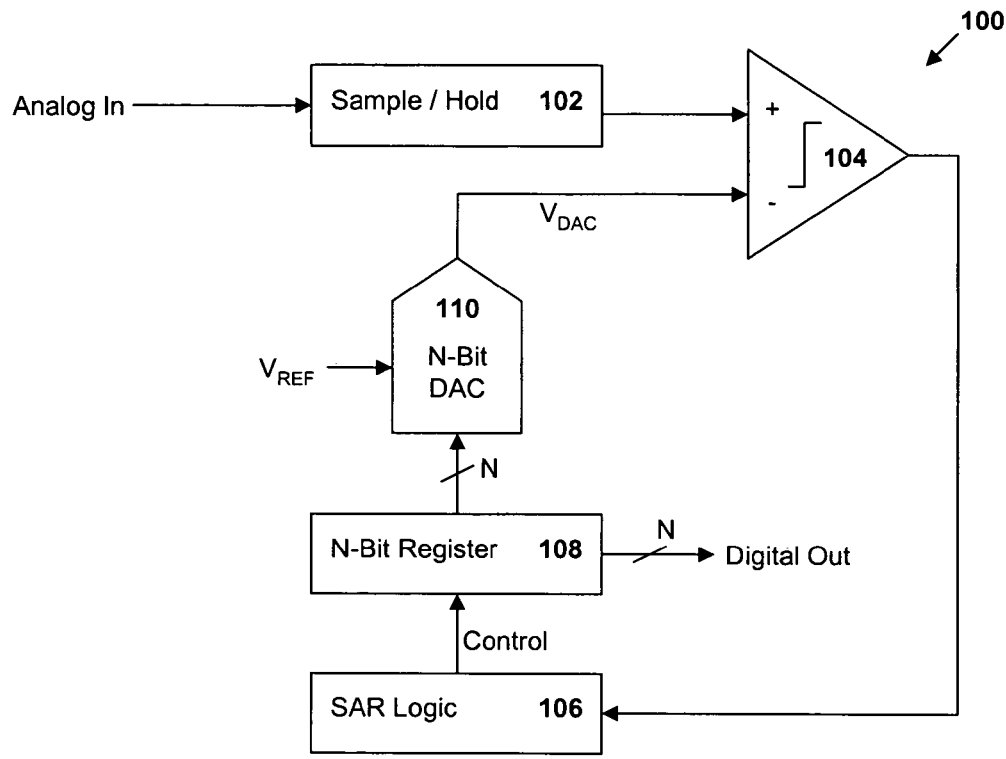
FIG. 1 is a block diagram of a prior art SAR ADC.
Figure 2:
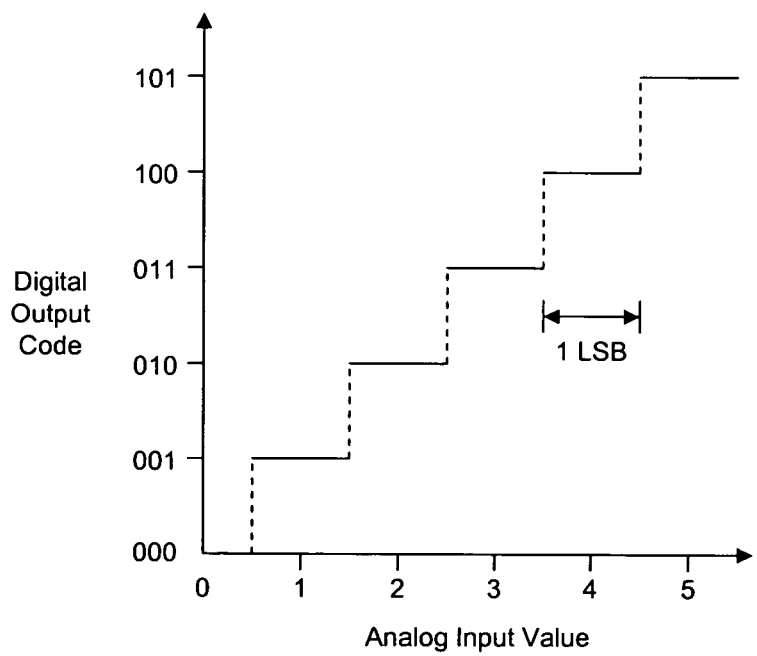
FIG. 2 is a plot of the transfer characteristics of an ideal ADC.
Figure 3:
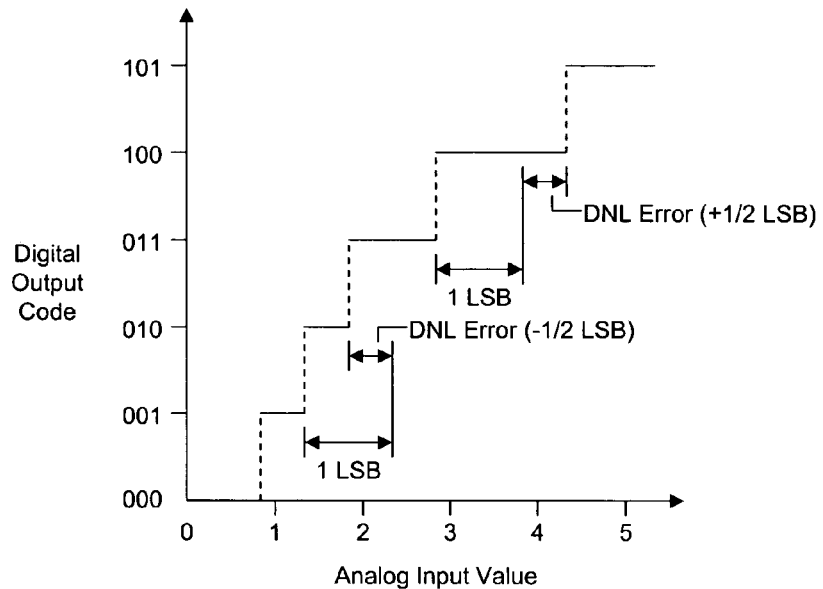
FIG. 3 is a plot illustrating DNL in the transfer characteristics of an ADC.
Figure 5:
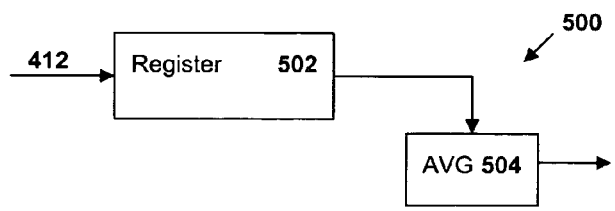
FIG. 5 illustrates logic to further reduce DNL in the present invention.
Figure 6:
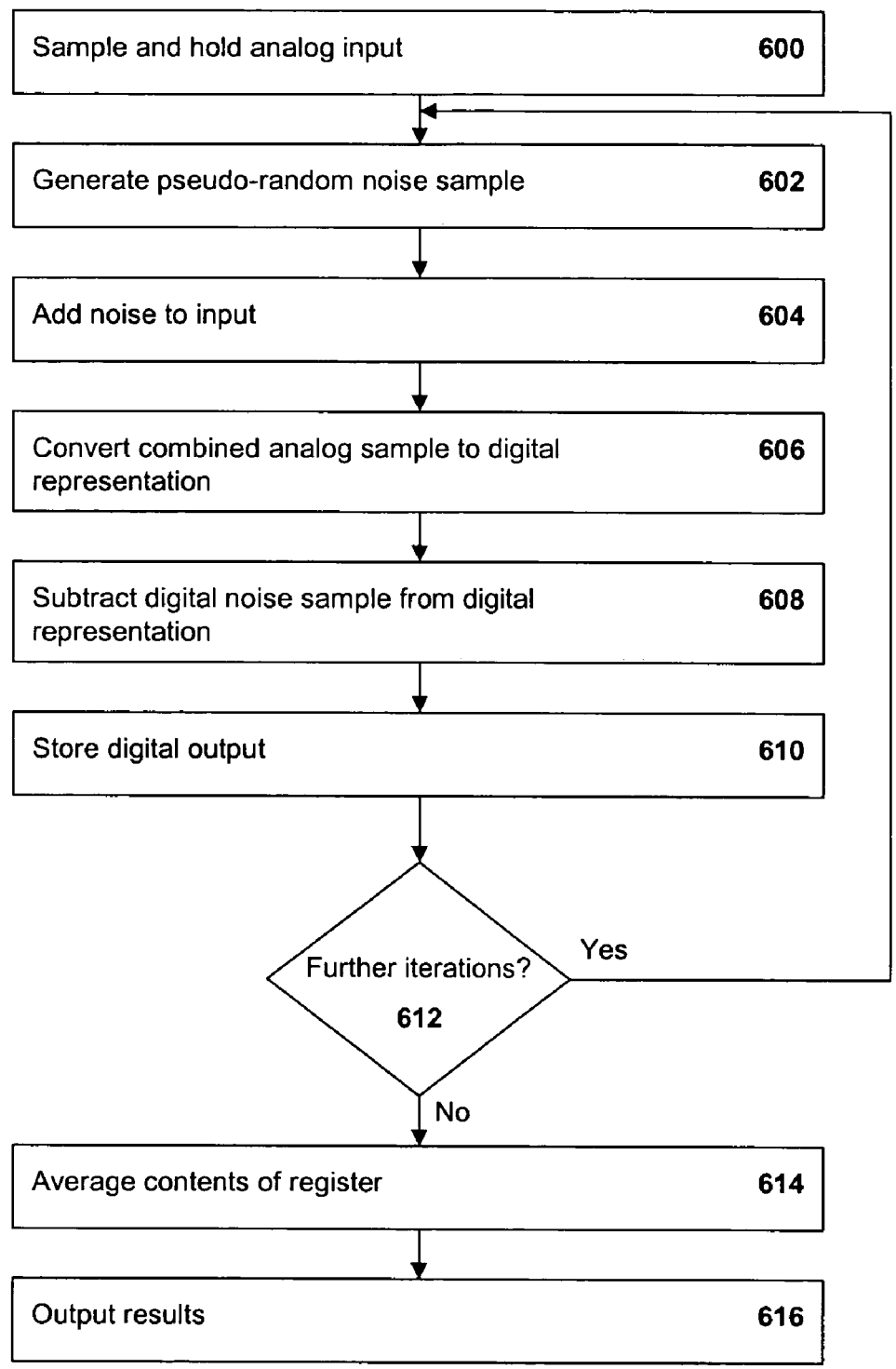
FIG. 6 is a flowchart of a method of the present invention illustrated in FIG. 5.

However, as indicated in the exemplary plot of FIG. 3, DNL may affect several portions of the transfer characteristic curve. FIG. 5 illustrates additional logic 500 which may be included in the present invention to further reduce DNL. Referring to the flowchart of FIG. 6 as well as to the block diagrams of FIGS. 4 and 5, the analog input signal $V_{IN}$ 404 is sampled (step 600) and the sample held. The pseudo-random noise generator 1200 generates a noise sample (step 602) which is added to the analog input signal $V_{IN}$ 404 (step 604). As in the embodiment of FIG. 4, the combined sample 406 is converted in the ADC 420 into a digital representation signal 408 (step 606) from which the noise sample 1202 is subtracted (step 608). The resulting digital output 412 is stored in a register 502 (FIG. 5) (step 610).

Additional pseudo-random noise samples may also be generated and applied in the same manner to the original analog input signal 404 with the resulting digital output also stored in the register 502. The process repeats for a predetermined number of iterations (step 612), each with a different set of noise samples but all with the original analog input sample 404. While any number of iterations may be used, too large a number increases the process time and may not significantly improve the performance of the conversion device 400. It has been found that four or eight iterations provides a reasonable balance between DNL reduction and overall performance. After the predetermined number of iterations has been complete (step 612) and the results stored in the register 502, the contents of the register 502 are averaged in an averaging device (AVG) 504 (step 614) and the final result is available to output (step 616). Thus, DNL, which may affect different portions of the transfer characteristics curve, may be effectively nullified.

Figure 7:
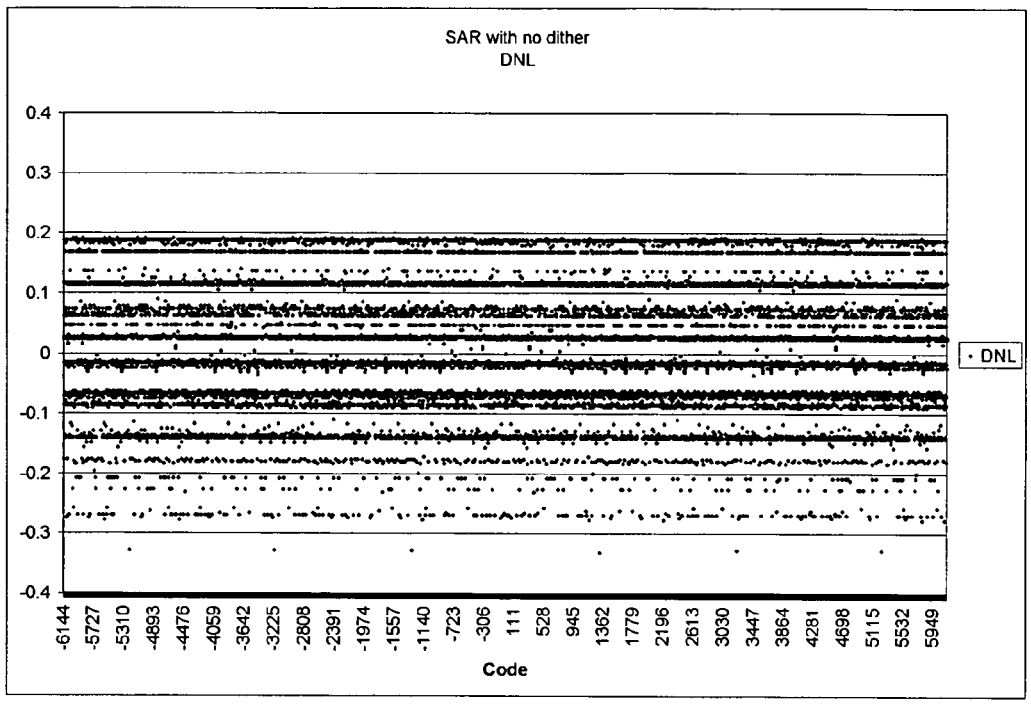
FIG. 7 is a plot of the output code of a prior art ADC.
Figure 8:
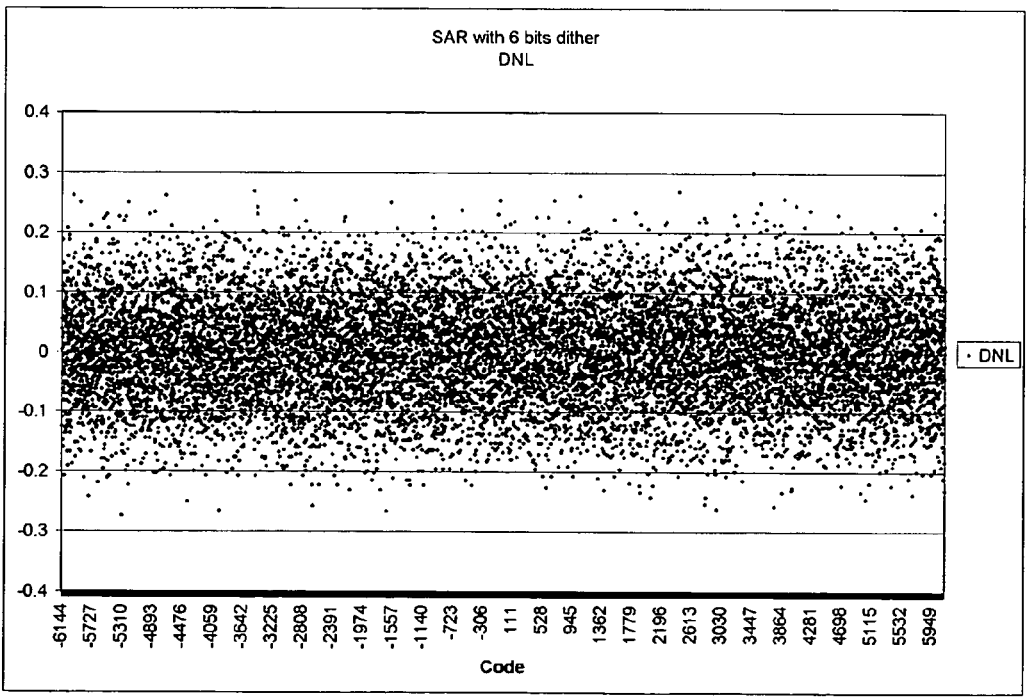
FIG. 8 is a plot of the output code of an ADC of the present invention.
Figure 9:
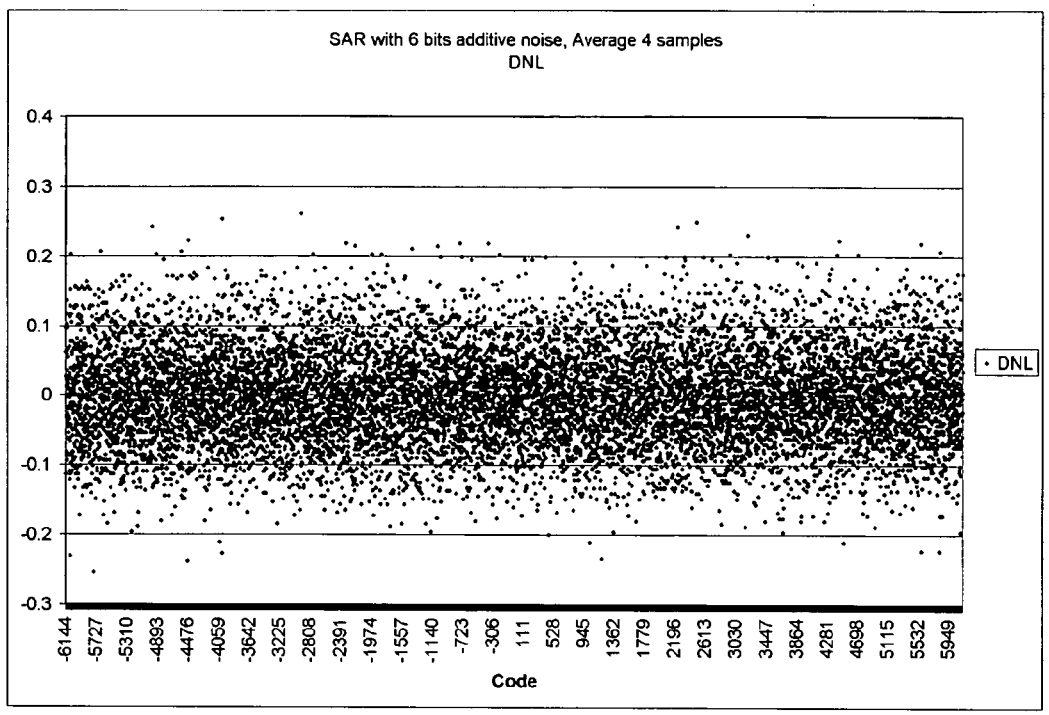
FIG. 9 is a plot of the output code of an ADC of the present invention in which four iterations are averaged.
Figure 10:
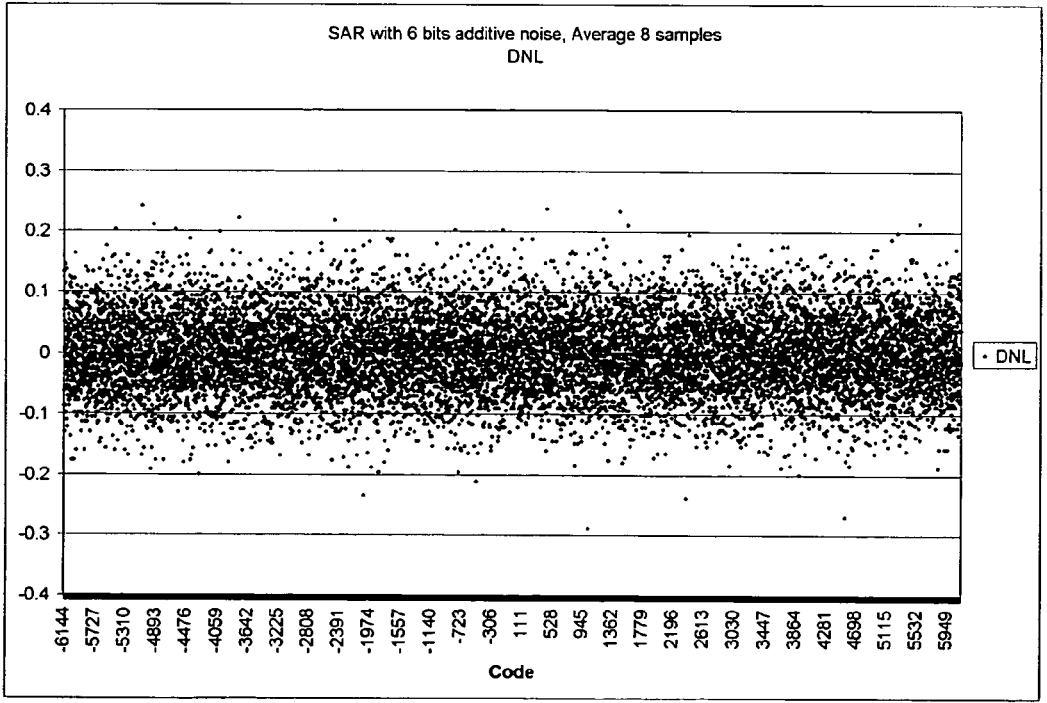
FIG. 10 is a plot of the output code of an ADC of the present invention in which eight iterations are averaged.

FIG. 7 is a plot of a portion of the output code of a prior art ADC which has a distinct structure in the DNL; the structure cannot be removed by averaging. FIG. 8 is a plot of a portion of the output code of an analog-to-digital conversion device 400 of the present invention. The output code does not have the distinct structure of FIG. 7, and thus DNL reduction may be performed by averaging in accordance with the present invention. By comparison, FIG. 9 is a plot of the output code of an analog-to-digital conversion device 400 of the present invention in which four DNL iterations are made and averaged while FIG. 10 is a plot of the output code of an analog-to-digital conversion device 400 of the present invention in which eight DNL iterations are made and averaged.

Figure 11:
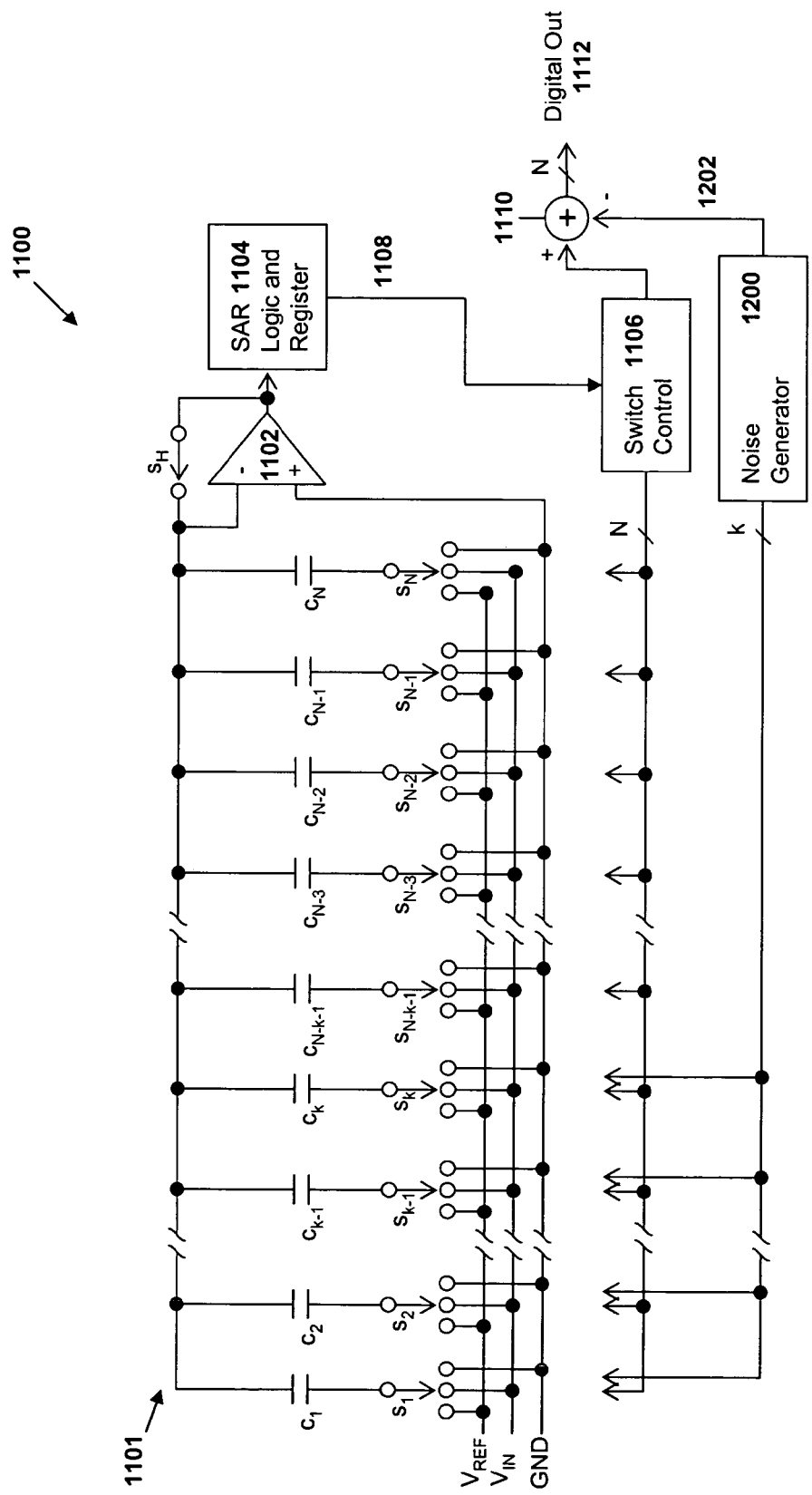
FIG. 11 is a block diagram of a digital noise generator which may be used with the present invention.

Referring to the block diagram of FIG. 11, the use of a charge redistribution DAC (CRDAC) in an N-bit SAR ADC 1100 to generate the noise to be injected and subtracted will be described. The ADC 1100 includes a charge redistribution DAC 1101, a comparator 1102 and an SAR logic and register block 1104 which outputs a digital representation of the analog input $V_{IN}$. For purposes of clarity in FIG. 11, the SAR logic and SAR register have been combined in the single block 1104 but in an actual implementation they may be separate. The DAC 1101 employs an array of N weighted capacitors $C_1$–$C_N$ and an equivalent number of three-way switches $S_1$–$S_N$ (or other functionally equivalent three-way elements). The weighting of the capacitor values may be calculated according to a radix=2 series or a radix <2 series, such as 1.8. An additional switch SH coupled between the output of the comparator 1102 and the common capacitor bus input to the comparator 1102 is used to auto-zero any offset errors in the comparator 1102.

The ADC 1100 further includes switch control logic 1106 having an input coupled to the output of the SAR logic/register 1104. During data conversion, an N-bit output of the switch control logic 1106 controls the switches $S_1$–$S_N$ to selectably connect the corresponding capacitors $C_1$–$C_N$ to a reference voltage $V_{REF}$, the analog input signal $V_{IN}$ or a ground GND.

Commonly-assigned U.S. Pat. No. 6,844,840 to Melanson describes an SAR ADC using three-way elements having an improved search algorithm. Commonly-assigned U.S. Pat. Nos. 6,404,375 and 6,424,276 to Muñoz et al. describe an ADC with a charge redistribution DAC in which the array of capacitors is weighted according to a redundant radix<2 series. All three patents are incorporated herein by reference in their entirety.

Figure 12:
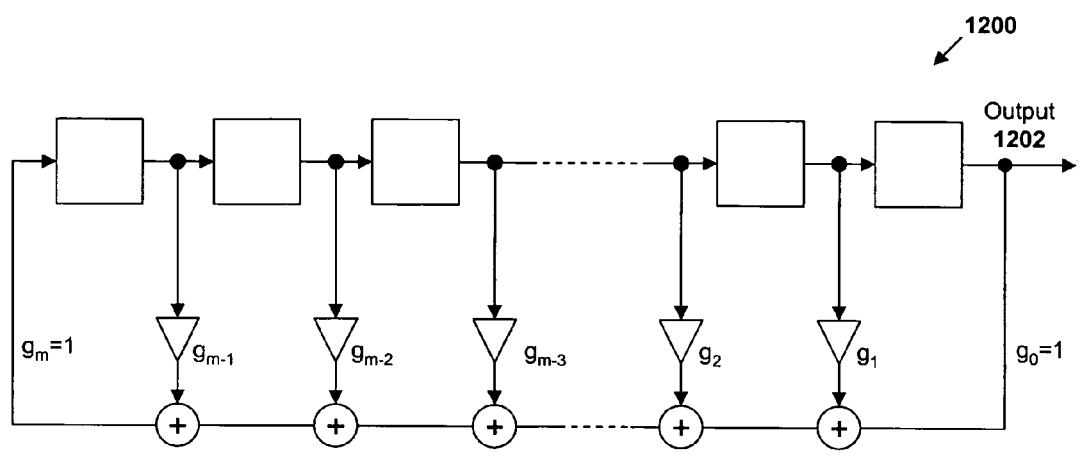
FIG. 12 is a block diagram of an embodiment of a DAC portion of a SAR ADC which may be programmed to function as a noise generator.

The ADC 1100 also includes a pseudo-random noise generator 1200 having a k-bit output coupled to control the switches associated with the capacitors $C_1$–$C_k$ of the ADC 1100 representing k bits of the DAC portion 1101. In FIG. 11, the switches associated with the capacitors representing the k least significant bits are used to generate the noise. However, switches associated with any of the capacitors, representing any k bits, may be used. FIG. 12 is a block diagram of one exemplary configuration of a noise generator 1200 in the form of an m-bit maximal length linear feedback shift register (LFSR) having m coefficients. In one implementation, m=6 and the coefficients have values of $g_6$=1, $g_5$=1, $g_4$=0, $g_3$=0, $g_2$=0, $g_1$=0 and $g_0$=1. Other configurations of an LFSR are known and may also be employed.

In operation, the capacitors $C_{k+1}$–$C_N$ are switched by the switch control to accept and store the analog input signal $V_{IN}$. The remaining capacitors $C_1$–$C_k$ are pseudo-randomly switched or preloaded under the direction of the noise generator 1200 to either $V_{REF}$ or ground GND rather than to the analog input $V_{IN}$. As previously noted, any k capacitors may be switched to stored the noise; the use of the capacitors representing the least significant k bits in this description is for illustrative purposes only and not by way of limitation. It will also be appreciated that the described order is also illustrative and not limiting; the noise may be generated and stored on the k capacitors before the analog input signal $V_{IN}$ is stored on the remaining N–k capacitors. Thus, analog dither or noise is added to the analog input $V_{IN}$. Subsequently, conversion of the analog input $V_{IN}$ to a digital representation at the output of the SAR logic/register 1104 proceeds; this output 1108 is coupled, through the switch control logic 1106, to an input of an adder 1110. The digital noise output 1202 of the noise generator 1200 is coupled to a second input of the summer 1110 where it is subtracted from the SAR logic/register output 1108, reducing the DNL from the final N-bit digital output 1112.

Preferably, the process of adding and subtracting noise is repeated multiple times (such as four or eight) with respect to the same analog input $V_{IN}$ and the digital outputs averaged. In this embodiment, the switching of the capacitors $C_1$–$C_k$, and thus the noise samples, vary with each iteration under the direction of the noise generator 1200. Moreover, the k capacitors chosen by the noise generator 1200 may differ from one iteration to the next. Thus, DNL may be reduced from different portions of the transfer characteristic curve rather than from just a single portion.

The objects of the invention have been fully realized through the embodiments disclosed herein. Those skilled in the art will appreciate that the various aspects of the invention may be achieved through different embodiments without departing from the essential function of the invention. The particular embodiments are illustrative and not meant to limit the scope of the invention as set forth in the following claims.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for reducing nonlinearities in an N-bit successive approximation analog-to-digital converter having a charge redistribution digital-to-analog portion (CRDAC), comprising:

storing an analog input signal sample in each of N–k capacitors in the CRDAC;

generating a first pseudo-random digital noise sample;

applying the first pseudo-random digital noise sample to capacitors in the CRDAC representing the remaining k bits, wherein a first pseudo-random analog noise sample corresponding to the first pseudo-random digital noise sample is added to the analog input signal sample to form a first combined analog signal sample;

converting the first combined analog signal sample to a first combined digital signal; and subtracting the first pseudo-random digital noise sample from the first converted digital combined signal to generate a first digital output signal sample.

2. The method of claim 1, further comprising:

generating a second pseudo-random digital noise sample;

applying the second pseudo-random digital noise sample to capacitors in the CRDAC representing k bits, wherein a second pseudo-random analog noise sample corresponding to the second pseudo-random analog noise sample is added to the analog input signal sample to form a second combined analog signal sample;

converting the second combined analog signal sample to a second converted combined digital signal;

subtracting the second pseudo-random digital noise sample from the second converted combined digital signal to generate a second digital output signal sample; and averaging the first and second digital output signal samples.

3. The method of claim 1, wherein:

the generating, applying, converting and subtracting steps are repeated four times to generate four digital output signal samples from the analog input signal sample; and the method further comprises averaging the four digital output signal samples.

4. The method of claim 1, wherein:

the generating, applying, converting and subtracting steps are repeated eight times to generate eight digital output signal samples from the analog input signal sample; and the method further comprises averaging the eight digital output signal samples.

5. The method of claim 1, wherein generating the first pseudo-random digital noise sample comprises generating the first pseudo-random digital noise sample in an m-bit maximal length linear feedback shift register (LFSR) having coefficients $g_0$–$g_m$.

6. The method of claim 5, wherein m=6 and the coefficients of the LFSR have values $g_6$=1, $g_5$=1, $g_4$=0, $g_3$=0, $g_2$=0, $g_1$=0 and $g_0$=1.

7. The method of claim 1, wherein values of the N capacitors in the CRDAC are calculated according to a radix=2 series.

8. The method of claim 1, wherein values of the N capacitors in the CRDAC are calculated according to a radix<2 series.

9. The method of claim 1, wherein N=8 and k=3.

10. A method for converting an analog signal into a digital signal, comprising:

storing an analog input signal sample in each of N–k capacitors in an N-bit successive approximation analog-to-digital converter having a charge redistribution digital-to-analog converter portion (CRDAC);

generating a pseudo-random digital noise sample;

applying the pseudo-random digital noise sample to capacitors in the CRDAC representing the remaining k bits, wherein a pseudo-random analog noise sample is added to the analog input signal sample to form a combined analog signal sample;

converting the combined analog signal sample into a combined digital signal sample;

subtracting the pseudo-random digital noise sample from the combined digital signal sample to generate a digital output signal sample;

repeating the generating, applying, converting and subtracting steps a plurality of times to provide a like plurality of digital output signal samples; and averaging the plurality of digital output signal samples.

11. The method of claim 10, wherein the plurality is four.

12. The method of claim 10, wherein the plurality is eight.

13. The method of claim 10, wherein generating the pseudo-random digital noise samples comprises generating the pseudo-random digital noise samples in an m-bit maximal length linear feedback shift register (LFSR) having coefficients $g_0$–$g_m$.

14. The method of claim 13, wherein m=6 and the coefficients of the LFSR have values $g_6=1$, $g_5=1$, $g_4=0$, $g_3=0$, $g_2=0$, $g_1=0$ and $g_0=1$.

15. The method of claim 10, wherein values of the N capacitors in the CRDAC are calculated according to a radix=2 series.

16. The method of claim 10, wherein values of the N capacitors in the CRDAC are calculated according to a radix<2 series.

17. The method of claim 10, wherein N=8 and k=3.

18. An apparatus for reducing nonlinearities in an N-bit successive approximation analog-to-digital converter, comprising:

a charge redistribution digital-to-analog converter portion (CRDAC);

N–k capacitors in the CRDAC for storing an analog input signal sample;

a pseudo-random noise generator operative to generate a first pseudo-random digital noise sample;

means for applying the first pseudo-random digital noise sample to capacitors in the CRDAC representing the remaining k bits, wherein a first pseudo-random analog noise sample is added to the analog input signal sample to form a first combined analog signal sample;

means for converting the first combined analog signal sample to a first combined digital signal; and means for subtracting the first corresponding pseudo-random digital noise from the first converted digital combined signal to generate a first digital output signal sample.

19. The apparatus of claim 18, further comprising:

control logic operable to direct that:

the pseudo-random noise generator generate a second pseudo-random digital noise sample;

the means for applying applies the second pseudo-random digital noise sample to the capacitors in the CRDAC representing k bits, wherein a second pseudo-random analog noise sample is added to the analog input signal sample to form a second combined analog signal sample;

the means for converting comprises converts the second combined analog signal to a second digital combined signal; and the means for subtracting subtracts the second corresponding pseudo-random digital noise from the second digital combined signal to generate a second digital output signal sample; and means for averaging the first and second digital output signal samples.

20. The apparatus of claim 18, wherein the control logic is further operable to direct that:

a plurality of pseudo-random analog noise samples be added to the analog input signal sample to form a like plurality of combined analog signal samples, each of the plurality of pseudo-random analog noise samples having a corresponding pseudo-random digital noise sample;

the plurality of combined analog signal samples be converted to a like plurality of digital combined signals;

each of the plurality of pseudo-random digital noise samples be subtracted from the corresponding combined digital signal sample to provide a like plurality of digital output signal samples; and the plurality of digital output signal samples be averaged.

21. The apparatus of claim 20, wherein the plurality is four.

22. The apparatus of claim 20, wherein the plurality is eight.

23. The apparatus of claim 18, wherein the pseudo-random noise generator comprises an m-bit maximal length linear feedback shift register (LFSR) having coefficients $g_0$–$g_m$.

24. The apparatus of claim 23, wherein m=6 and the coefficients of the LFSR have values $g_6=1$, $g_5=1$, $g_4=0$, $g_3=0$, $g_2=0$, $g_1=0$ and $g_0=1$.

25. The apparatus of claim 18, wherein values of the N capacitors in the CRDAC are calculated according to a radix=2 series.

26. The apparatus of claim 18, wherein values of the N capacitors in the CRDAC are calculated according to a radix<2 series.

27. An N-bit successive approximation analog-to-digital converter, comprising:

a charge redistribution digital-to-analog converter portion (CRDAC);

N–k capacitors in the CRDAC for storing an analog input signal sample;

a pseudo-random noise generator operative to generate 1 through j pseudo-random digital noise samples;

means for applying each pseudo-random digital noise sample to capacitors in the CRDAC representing the remaining k bits, wherein 1 through j pseudo-random analog noise samples corresponding to the 1 through j pseudo-random digital noise samples are added to the analog input signal sample to generate 1 through j combined analog samples;

means for converting the 1 through j combined analog samples into 1 through j corresponding digital representations thereof;

means for subtracting the 1 through pseudo-random digital noise samples from the corresponding 1 through j digital representation to generate 1 through corresponding digital output signal samples; and means for averaging the 1 through j digital signal output samples.

28. The analog-to-digital converter of claim 27, wherein j equals four.

29. The analog-to-digital converter of claim 27, wherein j equals eight.

30. The analog-to-digital converter of claim 27, wherein the pseudo-random noise generator comprises a m-bit maximal length linear feedback shift register (LFSR) having coefficients $g_0$–$g_m$.

31. The analog-to-digital converter of claim 30, wherein m=6 and the coefficients of the LFSR have values $g_6=1$, $g_5=1$, $g_4=0$, $g_3=0$, $g_2=0$, $g^1=0$ and $g_0=1$.

32. The analog-to-digital converter of claim 27, wherein values of the N capacitors in the CRDAC are calculated according to a radix=2 series.

33. The analog-to-digital converter of claim 27, wherein values of the N capacitors in the CRDAC are calculated according to a radix<2 series.

34. The analog-to-digital converter of claim 27, wherein N=8 and k=3.

* * * * *